United States Patent [19]

Babuka et al.

[11] Patent Number: 4,553,192
[45] Date of Patent: Nov. 12, 1985

[54] HIGH DENSITY PLANAR INTERCONNECTED INTEGRATED CIRCUIT PACKAGE

[75] Inventors: Robert Babuka; John L. Piechota; Leonard J. Poch, all of Vestal, N.Y.

[73] Assignee: International Business Machines Corporation, Armonk, N.Y.

[21] Appl. No.: 526,190

[22] Filed: Aug. 25, 1983

[51] Int. Cl.[4] .............................................. H05K 1/14
[52] U.S. Cl. .................................. 361/395; 339/17 M; 339/75 MP; 361/400
[58] Field of Search .......... 339/17 CF, 17 M, 17 LM, 339/75 MP; 361/401, 403, 415, 392, 395, 400

[56] References Cited

U.S. PATENT DOCUMENTS

| | | | |
|---|---|---|---|
| 2,065,611 | 4/1934 | Pulleyblank | 173/324 |
| 3,172,719 | 3/1965 | Paholek et al. | 339/186 |
| 3,391,383 | 7/1968 | Antes | 339/174 |
| 3,395,377 | 7/1968 | Straus | 339/17 |
| 3,701,071 | 10/1972 | Landman | 339/4 |
| 3,753,211 | 8/1973 | Pauza et al. | 339/75 |
| 3,771,109 | 11/1973 | Bruckner et al. | 339/174 |
| 3,842,189 | 10/1974 | Southgate | 174/52 S |
| 3,877,064 | 4/1975 | Scheingold et al. | 361/403 |
| 3,940,786 | 2/1976 | Scheingold et al. | 361/403 |
| 3,982,159 | 9/1976 | Dennis et al. | 361/403 |
| 4,052,118 | 8/1977 | Scheingold et al. | 339/17 CF |
| 4,220,383 | 9/1980 | Scheingold et al. | 339/17 |
| 4,278,311 | 7/1981 | Scheingold et al. | 339/17 CF |
| 4,354,720 | 10/1982 | Bakermans | 339/91 R |
| 4,381,131 | 4/1983 | Demnianiuk | 339/17 CF |

FOREIGN PATENT DOCUMENTS

| | | |
|---|---|---|
| 1074412 | 1/1966 | United Kingdom . |
| 1411789 | 10/1975 | United Kingdom . |
| 2100531 | 12/1982 | United Kingdom ........... 339/17 CF |

OTHER PUBLICATIONS

IBM Technical Disclosure Bulletin, vol. 18, No. 3, Aug. 1975, p. 642, Full Semiconductor Wafer Package, R. H. A. Watson.

"Full Semiconductor Wafer Package", R. H. A. Watson, IBM Technical Disclosure Bulletin, vol. 18, No. 3, Aug. 1975, p. 642.

"High-Density Printed Circuit Connector, R. W. Callaway et al, IBM Technical Disclosure Bulletin, vol. 8, No. 3, Aug. 1965, pp. 351-352.

Primary Examiner—A. D. Pellinen
Assistant Examiner—Gregory D. Thompson
Attorney, Agent, or Firm—Gerald R. Gugger; E. W. Galbi; Steven J. Meyers

[57] ABSTRACT

An integrated circuit module to printed circuit board interconnection system wherein the board has circuit pads to which spring contacts have one of their ends soldered to the pads. The module has circuit pads on one surface thereof and a pivotal connection is provided for loading the module onto the circuit board whereby the opposite ends of the spring contacts engage the circuit pads on the module with a wiping action and are retained in engagement therewith.

6 Claims, 2 Drawing Figures

HIGH DENSITY PLANAR INTERCONNECTED INTEGRATED CIRCUIT PACKAGE

BACKGROUND OF THE INVENTION

As is well-known in the industry, an integrated circuit package is used which comprises an integrated circuit ceramic module and a printed circuit board. Input-output (I/O) pins are mounted in holes in a ceramic substrate and are connected to metallized circuitry on the surface of the substrate. The I/O pins are soldered into plated-through holes in the printed circuit board to electrically interconnect the module and board. This type of interconnection system is costly to manufacture and assemble. Also, it has the disadvantage that when the module and board are interconnected a thermal cycle is employed during which a difference of expansion occurs between the ceramic substrate and the circuit board. This causes pins to crack or break their solder connection with the plated-through holes which results in circuit problems.

In present day technology, there is an ever-increasing demand for greater input-output density. This means a greater number of pin holes, pins and through holes. If in increasing the number of pin holes, holes are made near the edge of the ceramic substrate, they will have to be made smaller to prevent cracking of the ceramic. This means that smaller pins would be required, which raises a problem.

It became evident that it would be desirable to provide a different type of interconnection system which would provide high density and better reliability at a lower cost.

OBJECTS AND SUMMARY OF THE INVENTION

The present invention provides an interconnection system which utilizes mini spring contacts to electrically connect the integrated circuit module to the printed circuit board. A plurality of the spring contacts have one end soldered to circuit pads on the printed circuit board. A housing is provided for the printed circuit board and module, and means are provided for loading and retaining the module into the housing, whereby the spring contacts soldered to the circuit pads on the printed circuit board have their opposite ends in contact with circuit pads on the module. The configuration of the spring contact is such that when the module is loaded into the housing the solder joints between the spring contacts and the circuit board are subjected to compression and practically no tension or shearing stress. This eliminates the cracking or breaking of the solder joints.

Accordingly, a primary object of the present invention is to provide a novel and improved interconnection system for electrically connecting an integrated circuit module to a printed circuit board.

A further object of the present invention is to provide a novel and improved interconnection system which utilizes mini spring contacts to electrically connect an integrated circuit module to a printed circuit board.

Another object of the present invention is to provide a novel and improved interconnection system wherein a plurality of spring contacts have one end soldered to circuit pads on a printed circuit board and the opposite end in contact with circuit pads on an integrated circuit module.

A still further object of the present invention is to provide a novel and improved interconnection system comprising a plurality of spring contacts having one end soldered to circuit pads on a printed circuit board mounted in a housing and means for loading an integrated circuit module into the housing to position circuit pads on a surface of the module into contact with the opposite ends of the spring contacts.

A further object of the present invention is to provide a novel and improved interconnection system as in the preceding object wherein the spring contacts have a configuration such that loading of the module places the solder joints under compression with practically no tension or shearing stress.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
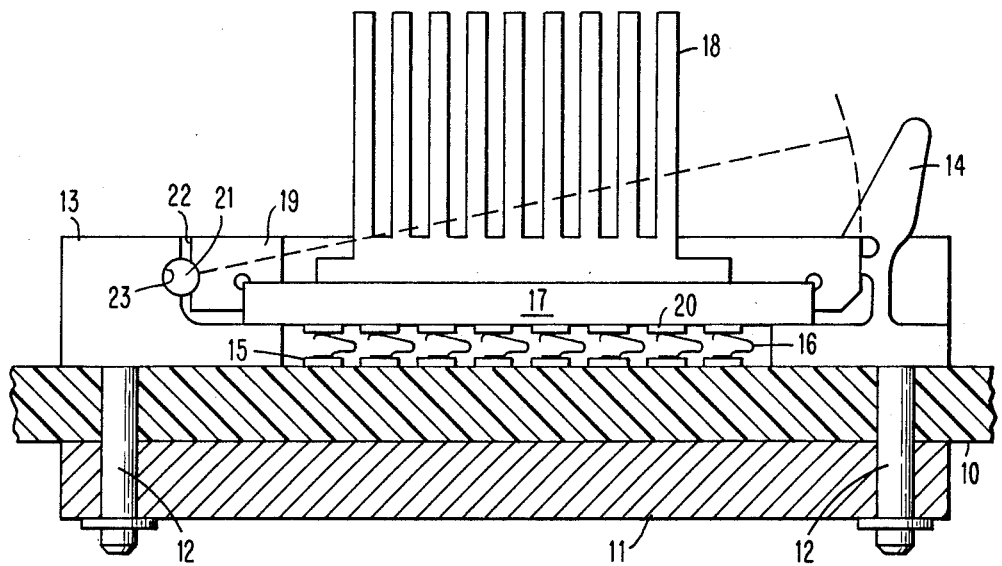
FIG. 1 is an assembly view of the circuit module, the printed circuit board and the interconnection system of the present invention.

Referring to FIG. 1, there is shown the assembly of the high density planar interconnected integrated circuit package of the present invention. A printed circuit board 10 is mounted on a suitable backer plate 11 and is fastened thereon by means of pins 12. A circuit board stiffener 13 having a trigger latch 14 is fastened to the board by means of pins 12, which extend from the stiffener to the backer plate. The board stiffener and trigger latch are made of a non-conductive material, such as, a polyphenylene oxide having a moderate flexual modulus to provide both stiffness to the board and flexure of the pivotal trigger latch. The printed circuit board has a plurality of circuit pads 15 and a plurality of mini spring contacts 16 are provided, each of which has its bottom end soldered to an associated circuit pad 15 on the board.

An integrated circuit module 17 having cooling fins 18 is provided which is bonded, for example, by epoxy to a module housing 19. The module housing is made of a non-conductive high strength material, such as, a glass filled polycarbonate. The bottom surface of the module is provided with a plurality of circuit pads 20 arranged in the same pattern as the circuit pads 15 on the printed circuit board.

The module housing 19 includes a pivot lug extension 21 along its edge 22. The board stiffener 13 is provided with a pivot slot channel 23 and the module is loaded into the assembly by engaging the lug extension into the pivot slot channel and pivoting the module housing in a clockwise direction, as indicated by the dotted lines, until the module housing snaps into engagement with the trigger latch 14, as shown in FIG. 1. This loading action places the module circuit pads 20 in contact with the top ends of the spring contacts 16. This method of loading provides both contact alignment and a mechanical advantage in that it allows lower insertion forces compared to that of straight "Z" axis plug designs. For example, straight plug in designs require an insertion force of from 100 to 300 grams, whereas the present design requires only 50 to 70 grams. The trigger latch assures module housing retention and seating plane positioning of the module assembly to the circuit board stiffener. To disengage the module assembly from the board stiffener, the trigger latch is drawn back allowing the module assembly to disengage and spring up for easy removal.

Figure 2:
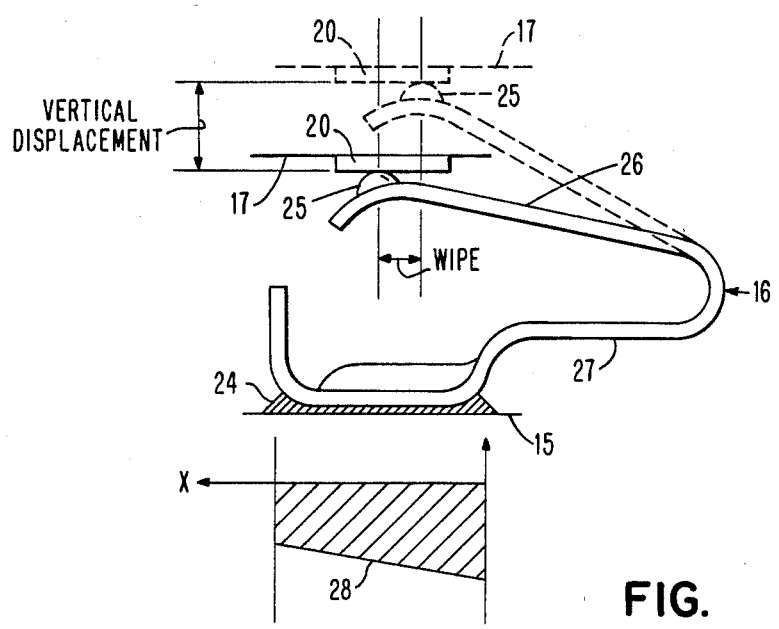
FIG. 2 is a view illustrating the configuration and operation of the spring contacts in the interconnection system of FIG. 1.

Referring now to FIG. 2, there is shown more clearly the configuration of the mini spring contacts 16 used to interconnect the integrated circuit module to the printed circuit board. The spring contact has a "U" shaped configuration and is made of a high yield strength spring material, such as, beryllium copper. As was previously mentioned, the bottom portion of the spring contact is soldered to a circuit pad on the printed circuit board, as indicated by the solder joint 24. The upper portion of the spring contact is provided with a contact point 25 which is of hard noble metallurgy and has a radius which is coincident with the hardness and normal force. The circuit pad 20 on the module may be, for example, soft gold over nickel over a suitable base metal.

In its normal unloaded condition, the upper portion of the spring contact assumes the position indicated by the dotted lines. When the module is loaded into the assembly, the spring contact is depressed to the position shown by the solid lines. Typical parameters, for example, would be a module loading pressure of 70 grams, which produces a vertical contact displacement of 0.023 inches and a contact point wipe of 0.014 inches on the module circuit pad. The displacement, in turn, produces deflection of the spring contact beam 26 to produce contact force. The contact force is dependent upon a number of factors, such as, spring material, size and geometry. The Hertz stress at contact point 25 is determined by contact force, geometry and contact metallurgy. Contact wipe is determined by geometry and deflection of the spring beam 26. The lower portion 27 of spring beam 26 is raised to clear the printed circuitry on the board, minimize the solder attachment area and to allow for offset design and resulting low stress at the attachment interface.

The graph 28 illustrates the compression force on the solder joint 24 as the module is loaded into the assembly. The initial contact on loading is at the right edge of the solder joint with a compression force, for example, of 320 pounds per square inch. As the module is loaded, the compression force decreases in the X-direction; and when the module is latched into position, the compression force at the left edge of the solder joint would be, for example, 200 pounds per square inch. Thus, the solder joints 24 are subjected to substantially a compression force with very little tension or shearing stress due to the configuration of the spring contacts. As a result, cracking or breaking of the solder joints during loading is eliminated. For a 50 mm module, for example, 420 spring contacts would be used.

It will be understood that all of the aforementioned parameters are illustrative and may vary depending on the size of the module and the spring contacts.

The use of spring contacts has the advantage that they compensate for any non-parallel relationship between the planar surfaces of the module and the printed circuit board. They also compensate for any bowing of the module and board during loading. Also, the spring contacts compensate for any differential of expansion between the module substrate and the circuit board during thermal cycling of the assembly, whereas the use of input-output pins may cause cracking of their solder connections.

Another point to be noted is that the position of the pivot lug 21 and channel 23 may be varied to change the amount of force and degree of wipe between the spring contacts and the circuit pads on the module.

In addition, the use of the spring contacts increases the number of circuit pads that can be used and the interconnections can be increased by approximately 33% over the use of input-output pins.

While there have been shown and described and pointed out the fundamental features of the invention as applied to the preferred embodiment, it will be understood that various omissions and substitutions and changes may be made in the form and details of the embodiment by those skilled in the art without departing from the spirit of the invention. The invention, therefore, is to be limited only as indicated by the scope of the following claims.

What is claimed is:

1. A module to planar board interconnection system for mitigating solder joint failure, comprising;
    an integrated circuit module having circuit pads on one surface thereof;
    a printed circuit board having circuit pads on one surface thereof;
    a housing for said integrated circuit module;
    means for loading and retaining said module and said housing onto said circuit board; and
    a plurality of spring contacts, each of said contacts having a U-shapelike configuration, said configuration having an upper end portion adapted to make contact with a circuit pad of said integrated circuit module, and a bottom end portion surface bonded by a solder joint to a circuit pad of said printed circuit board, said spring contacts and said means coacting to place each aforesaid solder joint under compression when said module is loaded and retained by said means whereby solder joint failure is mitigated.

2. A module to planar board interconnection system for mitigating solder joint failure, comprising;
    an integrated circuit module having circuit pads on one surface thereof;
    a printed circuit board having circuit pads on one surface thereof;
    a housing for said integrated circuit module;
    a board stiffener fastened to said printed circuit board;
    means for pivotally connecting said module housing to said circuit board stiffener and loading the module and housing onto said circuit board; and
    a plurality of spring contacts, each of said contacts having a U-shapelike configuration, said configuration having an upper end portion adapted to make contact with a circuit pad of said integrated circuit module, and a bottom end portion surface bonded by a solder joint to a circuit pad of said printed circuit board, said spring contacts and said means coacting to place each aforesaid solder joint under compression when said module is loaded by said means, whereby solder joint failure is mitigated.

3. A module to planar board interconnection system as set forth in claim 1 wherein during loading of the module onto the circuit board, said upper end portions of the spring contacts come into engagement with the circuit pads on the module with a wiping action.

4. A module to planar board interconnection system as set forth in claim 2 wherein said circuit board stiffener includes a flexible trigger latch for retaining the module housing and module in its loaded position on the circuit board.

5. The module to planar board interconnection system as set forth in claim 1 wherein an intermediate portion between said upper end portion and said bottom end portion of each of said contacts clears the printed circuitry on said printed circuit board.

6. The module to planar board interconnection system as set forth in claim 3 wherein each of said upper end portions of said contacts include a contact point, for effecting said wiping action.

* * * * *